(12) United States Patent
Rakshit et al.

(10) Patent No.: US 10,824,772 B2
(45) Date of Patent: Nov. 3, 2020

(54) DYNAMICALLY ADJUSTING GRIP PANEL

(71) Applicant: INTERNATIONAL BUSINESS MACHINES CORPORATION, Armonk, NY (US)

(72) Inventors: Sarbajit K. Rakshit, Kolkata (IN); Martin G. Keen, Ventura, NC (US); John M. Ganci, Jr., Raleigh, NC (US); James E. Bostick, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 16/202,823

(22) Filed: Nov. 28, 2018

(65) Prior Publication Data

US 2020/0167434 A1 May 28, 2020

(51) Int. Cl.
*G06F 30/00* (2020.01)
*G06F 3/0488* (2013.01)
*G06F 3/0354* (2013.01)
*G06F 3/0481* (2013.01)
*G06K 9/22* (2006.01)
*B43K 23/008* (2006.01)

(52) U.S. Cl.
CPC ............ *G06F 30/00* (2020.01); *B43K 23/008* (2013.01); *G06F 3/03545* (2013.01); *G06F 3/0481* (2013.01); *G06F 3/04883* (2013.01); *G06K 9/22* (2013.01)

(58) Field of Classification Search
USPC ........................................................ 716/106
See application file for complete search history.

(56) References Cited

U.S. PATENT DOCUMENTS

| | | |
|---|---|---|
| 6,330,359 B1 | 12/2001 | Kawabata |
| 6,626,598 B2 | 9/2003 | Schneider |
| 7,077,594 B1 | 7/2006 | Annerino |
| 7,745,207 B2 | 6/2010 | Jovanovich |
| 9,063,588 B2 | 6/2015 | Buelow et al. |
| 9,235,275 B2 | 1/2016 | Schantz et al. |
| 9,569,045 B2 | 2/2017 | Westerman |
| 9,817,489 B2 | 11/2017 | Lor et al. |
| 9,870,083 B2 | 1/2018 | Hinckley et al. |
| 2014/0198080 A1 | 7/2014 | Mankowski et al. |
| 2016/0334891 A1 | 11/2016 | Ozoemenam et al. |

(Continued)

OTHER PUBLICATIONS

Sun et al., Enhancing Naturalness of Pen-And-Tablet Drawing Through Context Sensing, ITS, 2011, entire document.

(Continued)

*Primary Examiner* — Bryce M Aisaka
(74) *Attorney, Agent, or Firm* — Patrick J. Daugherty; Daugherty & Del Zoppo Co., LPA

(57) ABSTRACT

Aspects determine optimal physical attribute values for defining a grip form factor on a microfluidic grip panel of a digital pen as a function of a correlation of the optimal physical attribute values to an intended use of the digital pen, wherein the optimal physical attribute values include a width dimension, a surface texture attribute, and shape pattern attribute that is defined as a function of the width dimension; and drive the microfluidic grip panel into a grip form corresponding to the determined optimal physical attribute values during use of the digital pen by a user.

20 Claims, 5 Drawing Sheets

(56) References Cited

U.S. PATENT DOCUMENTS

2017/0031470 A1    2/2017   Chae
2017/0108949 A1    4/2017   Barel
2017/0300170 A1   10/2017   Hinckley et al.
2018/0024650 A1    1/2018   Hou et al.
2019/0155477 A1*   5/2019   Busby ................. G06F 3/03543

OTHER PUBLICATIONS

Song et al., Grips and Gestures on a Multi-Touch Pen, CHI, 2011, entire document.

Hinkley et al., Motion and Context Sensing Techniques for Pen Computing, Proceedings of the 2013 Graphics Interface Conference, May 2013, entire document.

Hinckley et al., Sensing Techniques for Tablet+Stylus Interaction, Input Techniques, 2014, entire document, USA.

Peter Mell et al, The NIST Definition of Cloud Computing, National Institute of Standards and Technology, Publication 800-145, 2011, entire document.

\* cited by examiner

DYNAMICALLY ADJUSTING GRIP PANEL

TECHNICAL FIELD

The present invention relates generally to a method, system, and computer program product for automatic form factor adjustment. More particularly, the present invention relates to a method, system, and computer program product for customizing an implement form factor in response to user requirements.

BACKGROUND

Microfluidics refers to devices and systems that provide for precise control and manipulation of fluids that are geometrically constrained to a small, typically sub-millimeter, scale at which capillary penetration governs mass transport. Microfluidics are defined with respect to small volumes, such as defined in units of microliters (μL), nanoliters (nL) picoliters (pL), and enable mechanical applications having small size form factors that have low energy consumption.

Typically in microfluidic systems fluids are transported, mixed, separated or otherwise processed. The various applications of such systems rely on passive fluid control using capillary forces. In some applications, external actuation means are additionally used for a directed transport of the media. Examples are rotary drives applying centrifugal forces for the fluid transport on the passive chips. Active microfluidics refers to the defined manipulation of the working fluid by active (micro) components such as micropumps or microvalves. Micropumps supply fluids in a continuous manner or are used for dosing. Microvalves determine the flow direction or the mode of movement of pumped liquids.

SUMMARY

In one aspect of the present invention, a computer-implemented method comprises determining optimal physical attribute values for defining a grip form factor on a microfluidic grip panel of a digital pen as a function of a correlation of the optimal physical attribute values to an intended use of the digital pen, wherein the optimal physical attribute values include a width dimension, a surface texture attribute, and shape pattern attribute that is defined as a function of the width dimension and driving the microfluidic grip panel into a grip form corresponding to the determined optimal physical attribute values during use of the digital pen by a user.

In another aspect, a computer system has a hardware processor in circuit communication with a computer readable memory and a computer-readable storage medium having program instructions stored thereon. The processor executes the program instructions stored on the computer-readable storage medium via the computer readable memory and is thereby configured to determine optimal physical attribute values for defining a grip form factor on a microfluidic grip panel of a digital pen as a function of a correlation of the optimal physical attribute values to an intended use of the digital pen, wherein the optimal physical attribute values include a width dimension, a surface texture attribute, and shape pattern attribute that is defined as a function of the width dimension and drive the microfluidic grip panel into a grip form corresponding to the determined optimal physical attribute values during use of the digital pen by a user.

In another aspect, a computer program product has a computer-readable storage medium with computer readable program code embodied therewith. The computer readable program code includes instructions for execution which cause the processor to determine optimal physical attribute values for defining a grip form factor on a microfluidic grip panel of a digital pen as a function of a correlation of the optimal physical attribute values to an intended use of the digital pen, wherein the optimal physical attribute values include a width dimension, a surface texture attribute, and shape pattern attribute that is defined as a function of the width dimension and drive the microfluidic grip panel into a grip form corresponding to the determined optimal physical attribute values during use of the digital pen by a user.

BRIEF DESCRIPTION OF THE DRAWINGS

These and other features of embodiments of the present invention will be more readily understood from the following detailed description of the various aspects of the invention taken in conjunction with the accompanying drawings in which.

DETAILED DESCRIPTION

Figure 1:
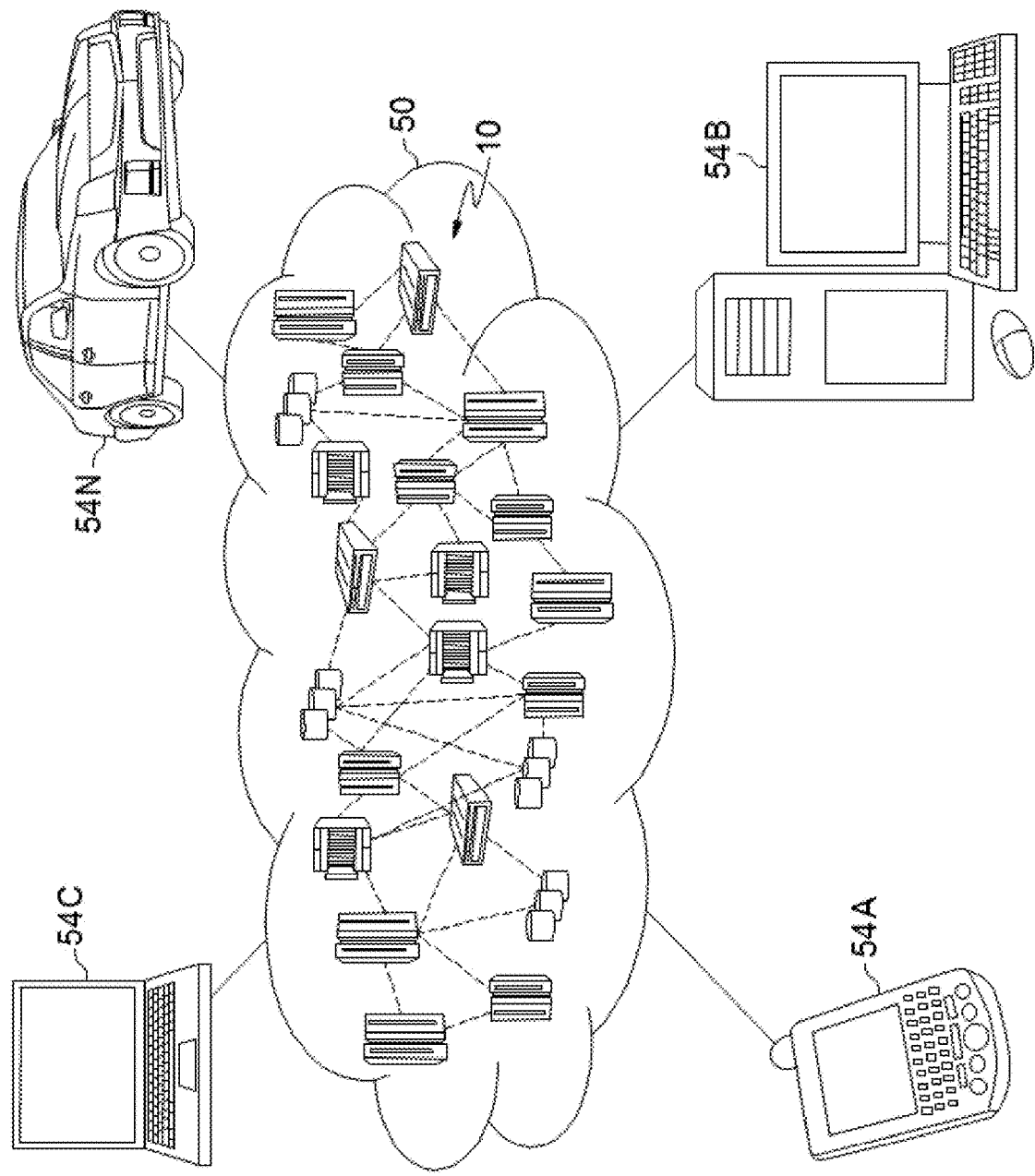
FIG. 1 depicts a cloud computing environment according to an embodiment of the present invention.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, mechanically encoded devices such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems; storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
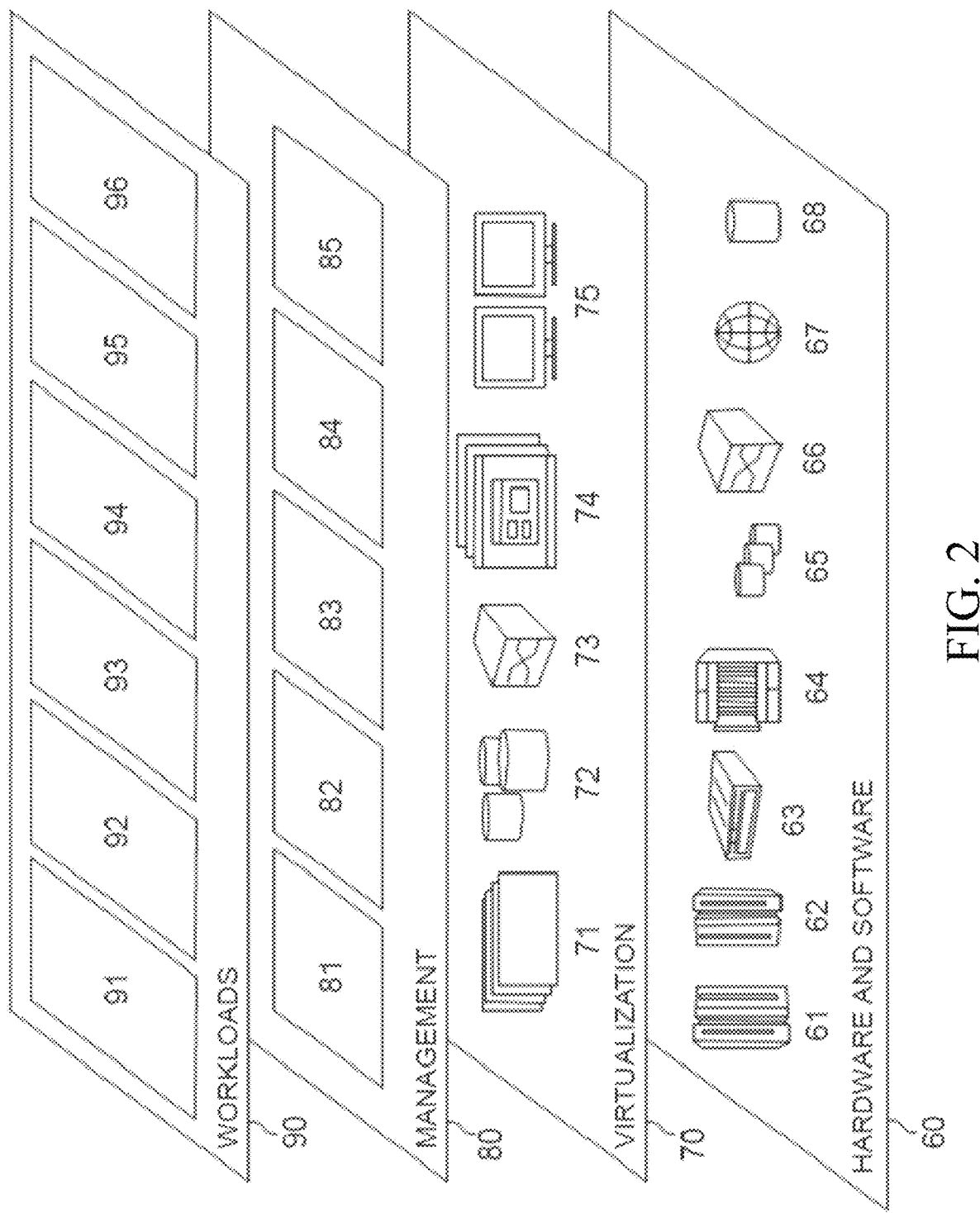
FIG. 2 depicts abstraction model layers according to an embodiment of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and processing for dynamically adjusting a microfluidic grip panel of a digital pen 96.

Figure 3:
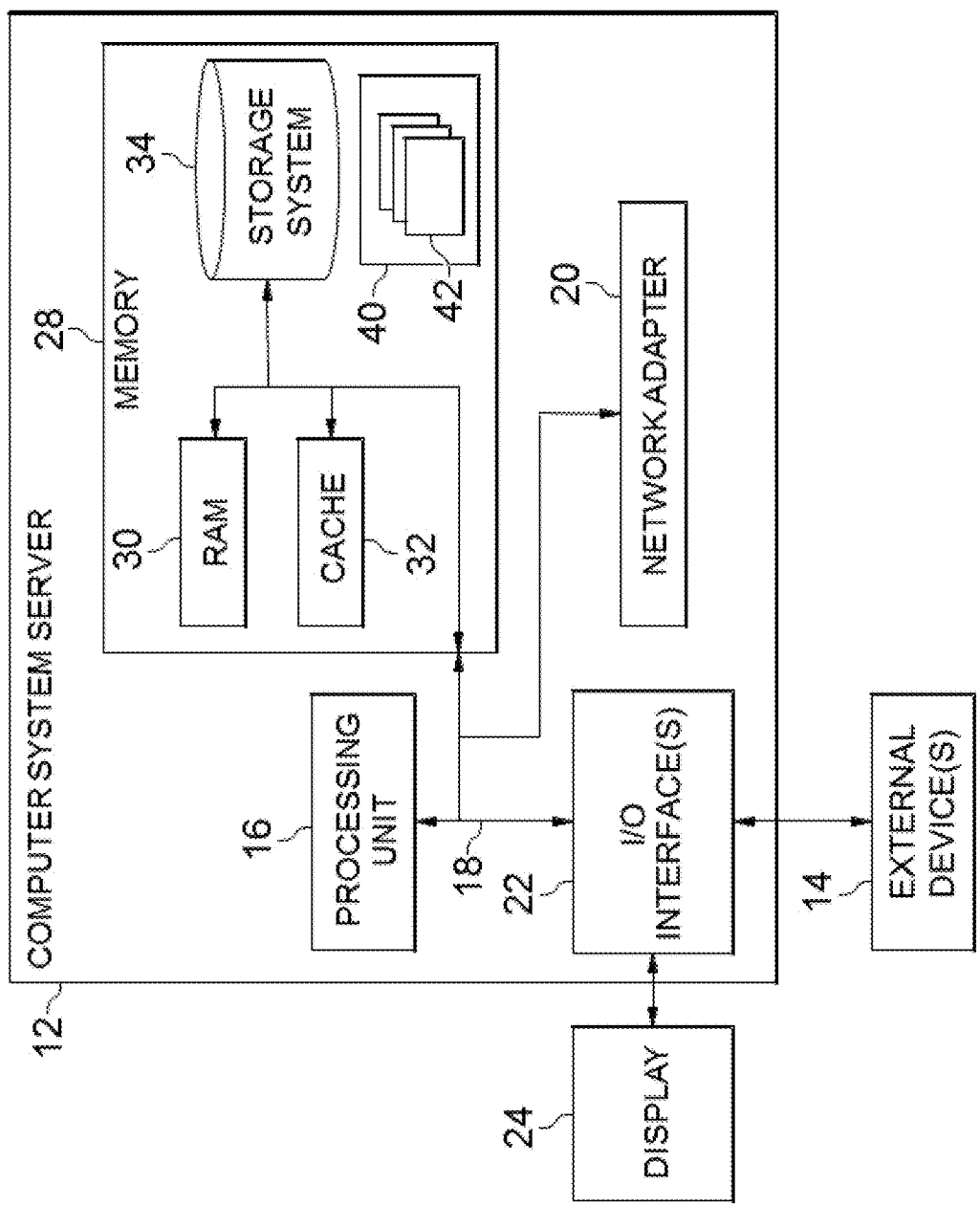
FIG. 3 depicts a computerized aspect according to an embodiment of the present invention.

FIG. 3 is a schematic of an example of a programmable device implementation 10 according to an aspect of the present invention, which may function as a cloud computing node within the cloud computing environment of FIG. 2. Programmable device implementation 10 is only one example of a suitable implementation and is not intended to suggest any limitation as to the scope of use or functionality of embodiments of the invention described herein. Regardless, programmable device implementation 10 is capable of being implemented and/or performing any of the functionality set forth hereinabove.

A computer system/server 12 is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

The computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

Figure 4:
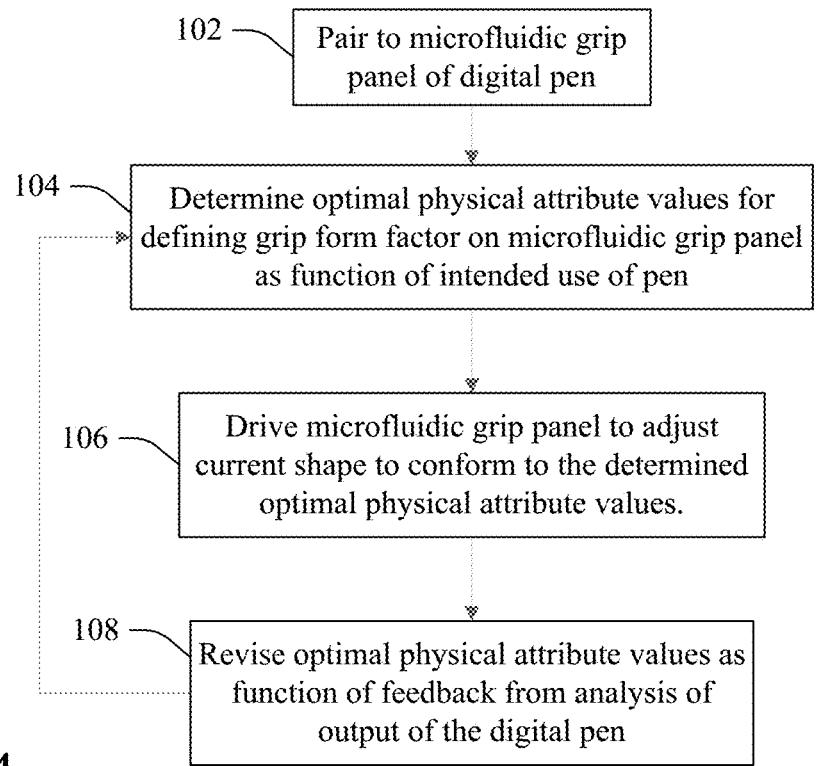
FIG. 4 is a flow chart illustration of an embodiment of the present invention.

FIG. 4 illustrates an embodiment of a process or system according to the present invention for dynamically adjusting a microfluidic grip panel of a digital pen. At 102, a processor that is configured according to an aspect of the present invention (the "configured processor") establishes a connection to a microfluidic grip panel on a digital pen device. The configured processor may be internal to the digital pen, or it may be located on a separate device that is paired to the digital pen. The configured processor may pair with the digital pen via a Bluetooth connection, a wireless local area network (WLAN), ultra-wideband radio, (UWB), Wi-Fi, or other connection methods.

The microfluidic grip panel utilizes microfluidics technology. Microfluidics work by defining channels beneath a panel which are filled with fluid. By increasing the pressure in the channels, the fluid pushes up the surface of the panel creating a tactile shape. This pressure is adjustable, enabling the shape to feel soft and squishy like a gel pack, or harder like a plastic key on a keyboard. Generally, microfluidic panels can be raised by deforming a surface, in response to a fluid entering various microfluidic channels. As presently described, a microfluidic grip panel is wrapped around a digital pen and aligned to form an engagement with user finger and hand surfaces during use of the pen by the user.

At 104, the configured processor determines optimal physical attribute values for defining a grip form factor on the microfluidic grip panel of the digital pen as a function of an intended use of the pen by a user. The optimal physical attribute values of the microfluidic grip panel include at least one width dimension, a surface texture attribute and a profile shape defined by the value(s) of the width dimension(s) and the surface texture attributes along a length dimension of the grip panel that is generally parallel to a central axis of the pen.

Embodiments may determine intended use as a function of intended use inputs. Intended use inputs are values supplied by a user of the digital pen or values that are automatically determined by the configured processor that correspond to a way the user would like to use the digital pen (e.g., line weight, or indicated writing utensil application). For example, a user may select a line weight to be drawn or produced by the digital pen. Different line weights may be associated with different optimal attribute values. Hence, the user selection of a given line weight may result in configured processor determining optimal physical attribute values that correspond to the selected line weight. Embodiments may further determine intended use as a function of intended use data (e.g., age of the user or historic user data).

At 106, the configured processor instructs (drives) the microfluidic grip panel to adjust a current profile shape of the microfluidic grip panel to conform to the optimal physical attribute values determined at 104.

At 108, the configured processor adjusts (revises) the optimal physical attribute values of the microfluidic grip panel as a function of feedback from analysis of the output of the digital pen, and correspondingly instructs (drives) the microfluidic grip panel to refine or further adjust the current shape of the microfluidic grip panel to conform to the adjusted physical attribute values in subsequent iterations at 106. Feedback analysis may include analyzing feedback inputs of the digital pen or microfluidic grip panel (e.g., a determination that the use has lost a grip on the digital pen), analyzing outputs generated by the digital pen in response to user motion inputs (e.g., broad or narrow strokes), an accuracy analysis (e.g., a determination that output data of the digital pen does not meet a quality threshold) or other feedback from the output of the digital pen.

A digital pen or a smart pen is an input device which captures the handwriting or brush strokes of a user and converts handwritten analog information created using "pen and paper" into digital data, enabling the data to be utilized in various applications. This type of pen is usually used in conjunction with a digital notebook, although the data can also be used for different applications or simply as a graphic. A digital pen is generally larger and has more features than an active pen. Digital pens typically contain internal electronics and have features such as touch sensitivity, input buttons, memory for storing handwriting data and transmission capabilities.

Figure 5:
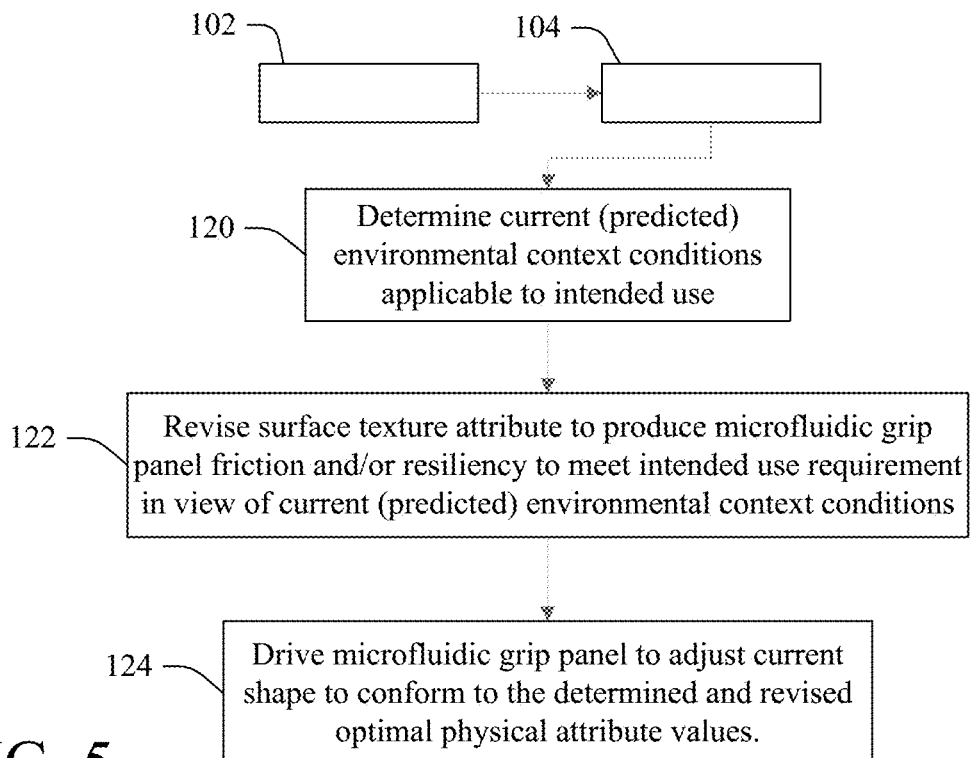
FIG. 5 is a flow chart illustration of another embodiment of the present invention.

FIG. 5 illustrates another embodiment of a process or system according to the present invention. As discussed above with respect to FIG. 4, a processor that is configured according to an aspect of the present invention (the "configured processor") establishes a connection to a microfluidic grip panel on a digital pen device at 102, and determines optimal physical attribute values for defining a grip form factor on the microfluidic grip panel of the digital pen as a function of an intended use of the pen by a user at 104.

At 120 the configured processor determines current (or predicted) environmental context conditions that are applicable to the intended use.

At 122 the configured processor revises the surface texture attribute to produce friction and/or resiliency of microfluidic grip panel that is more likely to meet intended use requirement in view of current (predicted) environmental context conditions.

At 124 the configured processor drives the microfluidic grip panel to adjust current shape of the microfluidic grip panel to conform to the determined and revised optimal physical attribute values.

Embodiments may revise the surface texture attribute at 122 to increase friction or softness in response to determining that current or projected environmental conditions indicated the user is likely to have wet hands (such as determining outdoors usage in rain, snow, underwater, etc. conditions); or sweaty hands (as caused by current hot or humid weather conditions, or through physical exertions from athletic activities, or performing life safety tasks (for example, an emergency medical technician, police officer or firefighter acting at a traffic accident, fire incident or emergency medical response, etc.). Thus, embodiments may revise optimal settings at 122 to revert to a default constant, flat profile over relative wider widths (and with a softer and high-friction texture (relative to attributes of the thin pencil profile), in order to provide a better grip on the microfluidic grip panel, while conveying a shape most likely to be easily, positively and consistently engaged in entering letters and numbers into forms, etc., under a variety of environmental conditions or constraints.

Figure 6:
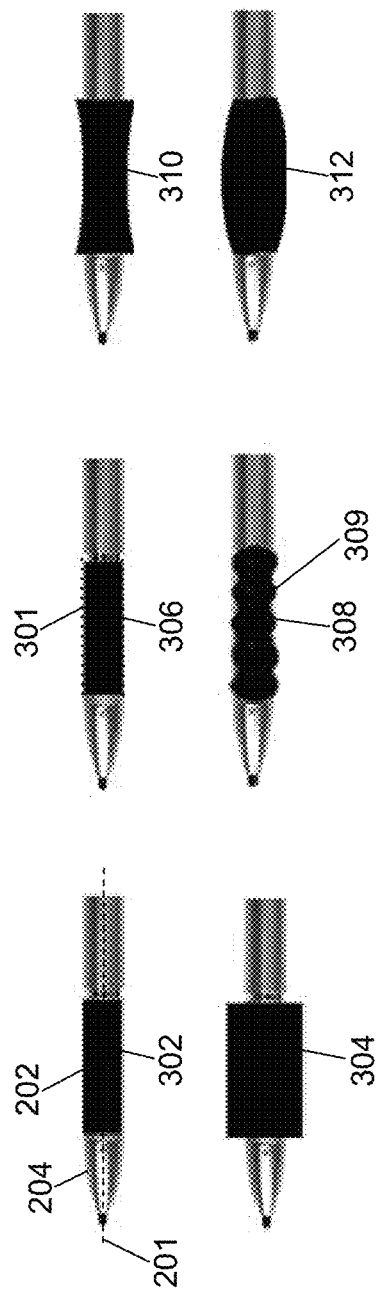
FIG. 6 depicts form factors of a microfluidic grip panel on a digital pen according to the present invention.

FIG. 6 provides some illustrative but not exhaustive examples of different profile shapes 302, 304, 306, 308, 310 and 312 that are formed by a microfluidic grip panel 202 of a digital pen 204 in response to instruction from embodiments of the present invention to conform to optimal physical attribute values, including as revised to accommodate dynamic environmental conditions. A flat thin shape 302 is defined by a relatively small or minimal width dimension (radius) from a central axis 201 of the digital pen, as compared to a flat thick shape 304 defined by a larger width dimension (radius) relative to said central axis of the digital pen.

A frictional surface texture profile 306 is defined by a matrix of small nodules 301, wherein the profile 306 thereby varies with respect to width dimensions along the panel relative to the central axis of the pen. The nodules 301 generate a frictional resistance engagement with user finger skin surfaces relative to motion forces conveyed along the panel surface relative to the pen axis when the fingers grip the panel 202, thereby stopping or resisting slippage of the finger skin along the profile surface 306 during manipulation and use of the pen by the user.

A bumpy or curvy profile 308 is defined by undulating, sinusoidal forms 309, wherein the profile 308 has a greater range of width dimensions along the panel relative to the central axis of the pen, relative to the frictional profile 306. A concave profile 310 is defined by varying the width of the panel surface relative to the pen axis from minimal values at the center to progressively larger values toward either end. A convex profile 312 is defined by varying the width of the panel surface relative to the pen axis from maximal values at the center to progressively smaller values toward either end.

The surface texture attribute of the optimal physical attribute values may further include or define softness or hardness values of the microfluidic grip panel. For example, the sinusoidal forms 309 of profile 308 may be defined with low microfluidic pressures that present a soft resiliency against engaging finger pressures, wherein they present a comfortable and positive engagement with user fingers, and wherein the resiliency adds to frictional resistance engagement with user finger skin surfaces relative to motion forces conveyed along the panel surface relative to the pen axis. By readily deforming in response to pressure from the user fingers, and wherein the resiliency of the panel form 308 softness cause the surface deformation to resist with a pressure equal of proportional to an amount of deformation, said resilient, resistance force brings the surface of the panel into a more positive engagement with the gripping fingers relative to regions that are not deformed by finger pressure.

In contrast, the thin flat profile 302 may be defined with a firmer microfluidic pressure relative to the soft pressure described with respect to the sinusoidal profile 308, so that the panel 202 presents a firm engagement with the user fingers.

Intended use inputs considered by embodiments to determine the physical attribute values of the microfluidic grip panel include user preference or selection data. Thus, the user may set default preference values of width, surface texture, and shape pattern dimensions, for example, as defined by a set of physical attribute values that the user prefers most often, or for a specific application, etc. For example, in response to different profile data including most-often selected or used profile form factors for different users, embodiments select a first set of optimal physical attribute values that define the convex shape 310 along large width values and with a smooth (hard) surface for a first user, and a different, second set of optimal physical attribute values that define the concave profile 312 along a narrower range of widths (for example, wherein the narrowest end width is the minimum width value obtainable on the panel relative to the central axis of the pen) and with a frictional surface (such as defined by a matrix of the nodules 301) for a different, second user.

Intended use inputs considered by embodiments to determine the physical attribute values of the microfluidic grip panel also include line weights drawn or produced by a stylus element of the pen in response to user manipulation of the digital pen, wherein different line weights are associated with different optimal physical attribute values. In some embodiments average or over-all panel width or thickness values vary in proportion to differences in thickness or weight of the output drawn line (thinner panels for thinner lines). For example, in response to an intended use input indicating that the generated line weight is a thin or fine-line weight, the configured processor determines (selects) the optimal shape dimensions of the microfluidic grip panel to comprise a first width dimension that is generally constant, in combination with a smooth surface texture attribute. In contrast, for a thicker line weight, the configured processor determines the optimal shape dimensions of the microfluidic grip panel to define the convex form 310 over a plurality of width dimensions (relative to the central axis) that are generally (on average, etc.) larger than the first width dimension of the flat, smooth profile 302 chosen for the thin line output (which may be chosen in response to data indicating that a convex form is most often performed for the thicker line form), in combination with a rougher surface texture (for example, the sinusoidal 308 or frictional profile 306) that is preferred (most commonly among all users historically) for use in generating thicker output line weight.

Intended use inputs considered by embodiments to determine the physical attribute values of the microfluidic grip panel also include type of indicated writing utensil application, such as selected by the user. Illustrative but not exhaustive examples of type of indicated writing utensil application include as a highlighter, a pen, a fine pencil, a crayon, a paint brush, etc. For example, in response to an input indicating that a writing utensil application is a pencil, the configured processor determines the optimal physical attribute values of the microfluidic grip panel to comprise a width dimension that is generally constant relative to the pen axis and corresponds to a conventional pencil width, in combination with a smooth, hard texture that is similar to the feel and form factor or a wooden pencil. In response to another input indicating that the selected writing utensil application is a highlighter, the configured processor determines the optimal physical attribute values of the microfluidic grip panel to comprise a second width dimension that is larger than the first width dimension and corresponds to conventional highlighter width with a generally smooth texture.

Some embodiments determine the optimal physical attribute values as a function of intended use data that includes the age of the user, wherein the attribute values as selected in response to historic data correlating (associating) different specific dimensions with differences in hand and grip dexterity, muscle strength or elasticity that are found (predicted) to occur between different age groups. Thus, in one embodiment the configured processor compares the age of the pen user to a first minimum age threshold of "X" years old that is correlated (in knowledgebase data) with the on-set of mature development within children of hand and grip dexterity and muscle strength; and to a second, maximum age threshold of "Y" years old, at which adult users of the same age or older typically begin to experience aging-related diminishment in muscle strength and elasticity, or arthritic limitations to movements that correspondingly limit dexterity or the ability to consistently generate fine-grained, fluid hand motions to create small-scale lettering or designs. Accordingly, in response to determining the user age is less than X, the configured processor selects grip panel attributes to define the convex shape profile 310 with a smooth yet soft texture over a range of widths from medium to large (wide), as a function of association with shape data shown to prevent finger pain in young children during repetitive motion exercises, such as practicing lettering at school. In response to determining the user age is equal to or greater than X and less than Y, the configured processor selects default grip panel attributes that define a rigid, smooth texture over the flat, constant thin width profile 302, as most appropriate for general tasks including fine lettering and detail drawing tasks for mature device users. Lastly, in response to determining the user age is equal to or greater than Y, the configured processor selects grip panel attributes to define the concave profile 310 that is defined over a range of widths from thin to wide, as an optimal shape to enable arthritic or less dexterous hands to find a comfortable and consistent grip position; and having a soft resilience (firmness) and the sinusoidal profile 308 or high friction profile 306, to better enable the user to maintain a grip engagement over all likely drawings strokes, without slipping or dropping the pen.

Embodiments may determine the intended use by considering intended use inputs and intended use data simultaneously. For example, intended use data may include the user's age corresponds to a child's age as described herein and intended use inputs may include a user selected a pencil as a writing utensil. The configured processor may determine the optimal physical attribute values as a combination of physical attribute values that correspond to a child and a pencil as described herein.

Feedback inputs considered by embodiments in revising the optimal physical attribute values include data indicating the user has lost grip on the microfluidic grip panel, or is otherwise inconsistently gripping the grip panel. For example, embodiment revise one or more of the optimal physical attribute values in response to determining an amount of pressure applied to the microfluidic grip panel as determined by pressure sensor components incorporated into the grip panel is inconsistent or variable over time relative to expected pressures associated with the pen output (for example, relative to values expected for the sizes and types of letters output to a form-field on a graphical user interface (GUI) display); or has fallen below an expected, minimum threshold pressure to engage and use the pen. In response to the feedback data, embodiments may iteratively revise the current optimal shape dimensions (for example, to include a bumpier texture relative to original settings, and/or soften a rigidity of the generated grip panel surface, in order to aid in the user maintaining a better grip on the microfluidic grip panel and thereby the digital pen) until grip pressure values obtained from the pressure sensor components meet expected quality standards.

Embodiments may determine or revise the optimal physical attribute values of the microfluidic grip panel as a function of feedback analysis of outputs generated by the digital pen in response to user motion inputs, and/or of other attributes of the generated outputs. For example, in response to input from a user of motions that generate intricate output content including forming small letters (for example, less than a threshold dimension in height or width) or creating a sketch with small delicate strokes (for example, strokes that are less than a threshold dimension in length, or are drawn with a threshold frequency per square centimeter of drawing surface) embodiments revise the current optimal physical attribute values of the microfluidic grip panel to include a new width dimension that corresponds to a width of known, smaller gripped, conventional writing devices typically (historically) used to generate such drawing outputs (for example, to the width (relatively thin), form (uniform) and surface texture (flat and smooth) of an artist's writing utensil (pen or pencil)), in order to better accommodate finer inputs and likely execute satisfactory drawing outputs.

In contrast, in response to user motion inputs that generate simpler output content including forming broad strokes (for example, large letters, block figures, shading or big sweeping gestures) the configured processor revises the optimal physical attribute values to include a width that corresponds to a larger gripped conventional writing device typically used to generate such drawing outputs: for example, to the width (relatively wide), form (uniform) and surface texture (flat and smooth) of a writing utensil (a paintbrush or marker, etc.) that is historically or otherwise indicated in knowledge base data as appropriate for use in accommodating user inputs to generate broader design outputs.

Embodiments also adjust the optimal physical attribute values of the microfluidic grip panel as a function of an accuracy analysis of or other feedback from the output of the digital pen. Thus, in response to determining that output data of the digital pen does not meet a quality threshold, some embodiments iteratively adjust a current value of one of the optimal physical attribute values used to drive the microfluidic grip panel into the currently deployed grip form to bring the adjusted value closer to a historic value that is associated with historic output data of the digital pen that meets the quality threshold. For example, in response to determining that the user deletes drawing outputs of the digital pen a threshold number of times or frequency within a threshold time period, the configured processor revises the determined width, shape and/or texture dimensions to alternative dimensions that are determined to better correspond to the observed input data used to generate the erased content: for example, incrementally reducing the panel thickness, flattening a shaped format or smoothing a texture generated on the surface of the grip panel in response to determining that a stroke rate meets a threshold that indicates fine-line drawing outputs, or incrementally increasing the panel thickness, generating a more concave or convex shape profile or increasing a roughness of the grip panel surface in response to determining that the stroke rate is less than the fine-line drawing output threshold. Embodiments may continue to iteratively revise the physical attribute values, or try alternative combinations (for example, decreasing width while increasing texture or irregularity of shape forms) until the feedback indicates that the deletions drop below the threshold number of times/frequency within a threshold time period.

Digital pens enable a user to input text and sketches as if they were using a physical pencil, pen, or highlighter. Modern digital pens are more than pieces of plastic—they contain a processor, battery, and wireless capabilities to communicate with mobile devices. A single digital pen may represent multiple pen types, wherein a user may select from software user input (UI) elements which pen type the digital pen should represent. However, in the prior art the form factor of the digital pen remains generally unchanged, regardless of a particular user application. The static form factor of the prior art digital pen does a poor job of simulating the different form factors that are found individually advantageous in different applications as pencil, pens, markers, paint brushes and other conventional tools that may be replaced by the digital pen.

In contrast, aspects of the present invention derive optimal physical attribute values for a microfluidic grip panel that may dynamically change based on user needs. For example, a user may begin writing simple text that requires a small width microfluidic grip panel. At a later moment, the user may begin drawing an image using broad strokes that requires a larger width microfluidic grip panel. The present invention enables the microfluidic grip panel to dynamically change its physical shape based on this change in user need.

The terminology used herein is for describing particular aspects only and is not intended to be limiting of the invention. As used herein, the singular forms "a", "an" and "the" are intended to include the plural forms as well, unless the context clearly indicates otherwise. It will be further understood that the terms "include" and "including" when used in this specification specify the presence of stated features, integers, steps, operations, elements, and/or components, but do not preclude the presence or addition of one or more other features, integers, steps, operations, elements, components, and/or groups thereof. Certain examples and elements described in the present specification, including in the claims, and as illustrated in the figures, may be distinguished, or otherwise identified from others by unique adjectives (e.g. a "first" element distinguished from another "second" or "third" of a plurality of elements, a "primary" distinguished from a "secondary" one or "another" item, etc.) Such identifying adjectives are generally used to reduce confusion or uncertainty, and are not to be construed to limit the claims to any specific illustrated element or embodiment, or to imply any precedence, ordering or ranking of any claim elements, limitations, or process steps.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   determining optimal physical attribute values for defining a grip form factor on a microfluidic grip panel of a digital pen as a function of a correlation of the optimal physical attribute values to an intended use of the digital pen, wherein the optimal physical attribute values include a width dimension, a surface texture attribute, and shape pattern attribute that is defined as a function of the width dimension; and
   driving the microfluidic grip panel into a grip form corresponding to the determined optimal physical attribute values during use of the digital pen by a user.

2. The method of claim 1, further comprising:
   integrating computer-readable program code into a computer system comprising a processor, a computer readable memory in circuit communication with the processor, and a computer readable storage medium in circuit communication with the processor; and
   wherein the processor executes program code instructions stored on the computer-readable storage medium via the computer readable memory and thereby performs the determining the optimal physical attribute values and the driving of the microfluidic grip panel into the grip form corresponding to the determined optimal physical attribute values.

3. The method of claim 1, wherein the computer-readable program code is provided as a service in a cloud environment.

4. The method of claim 1, wherein the intended use of the digital pen comprises drawing an output line having a line weight thickness via a stylus element of the pen; and
   wherein determining the optimal physical attribute values for defining the grip form factor on the microfluidic grip panel comprises setting the width dimension used to define the shape pattern along a length of the microfluidic grip panel to a value chosen in proportion to the line weight thickness value.

5. The method of claim 1, wherein the surface texture attribute comprises a hardness value that defines an amount of resilience force of the grip panel that resists against deformation of the panel from engaging finger pressure.

6. The method of claim 5, further comprising:
   in response to determining that the user has trouble maintaining an engagement of the grip panel during operation of the pen, revising the hardness value of the surface texture attribute to drive the microfluidic grip panel to convey a softer resilience to the user.

7. The method of claim 6, further comprising:
   in response to determining wet conditions for engaging the grip panel, revising the surface texture attribute to drive the microfluidic grip panel to form a high-friction surface texture.

8. The method of claim 6, further comprising:
   in response to determining that output data of the digital pen does not meet a quality threshold, iteratively adjusting a current value of one of the optimal physical attribute values used to drive the microfluidic grip panel into the grip form to bring the adjusted value closer to a historic value that is associated with historic output data of the digital pen that meets the quality threshold.

9. A computer system comprising:
   a processor;
   a computer readable memory in circuit communication with the processor; and
   a computer readable storage medium in circuit communication with the processor;
   wherein the processor executes program instructions stored on the computer-readable storage medium via the computer readable memory and thereby:
   determines optimal physical attribute values for defining a grip form factor on a microfluidic grip panel of a digital pen as a function of a correlation of the optimal physical attribute values to an intended use of the digital pen, wherein the optimal physical attribute values include a width dimension, a surface texture attribute, and shape pattern attribute that is defined as a function of the width dimension; and
   drives the microfluidic grip panel into a grip form corresponding to the determined optimal physical attribute values during use of the digital pen by a user.

10. The system of claim 9, wherein the intended use of the digital pen comprises drawing an output line having a line weight thickness via a stylus element of the pen; and
    wherein the processor executes program instructions stored on the computer-readable storage medium via the computer readable memory and thereby determines the optimal physical attribute values for defining the grip form factor on the microfluidic grip panel by setting the width dimension used to define the shape pattern along a length of the microfluidic grip panel to a value chosen in proportion to the line weight thickness value.

11. The system of claim 9, wherein the surface texture attribute comprises a hardness value that defines an amount of resilience force of the grip panel that resists against deformation of the panel from engaging finger pressure.

12. The system of claim 11, wherein the processor executes program instructions stored on the computer-readable storage medium via the computer readable memory and thereby, in response to determining that the user has trouble maintaining an engagement of the grip panel during operation of the pen, revises the hardness value of the surface texture attribute to drive the microfluidic grip panel to convey a softer resilience to the user.

13. The system of claim 12, wherein the processor executes program instructions stored on the computer-readable storage medium via the computer readable memory and thereby, in response to determining wet conditions for engaging the grip panel, revises the surface texture attribute to drive the microfluidic grip panel to form a high-friction surface texture.

14. The system of claim 12, wherein the processor executes program instructions stored on the computer-readable storage medium via the computer readable memory and thereby, in response to determining that output data of the digital pen does not meet a quality threshold, iteratively adjusts a current value of one of the optimal physical attribute values used to drive the microfluidic grip panel into the grip form to bring the adjusted value closer to a historic value that is associated with historic output data of the digital pen that meets the quality threshold.

15. A computer program product comprising:
a computer readable storage medium having computer readable program code embodied therewith comprising instructions for execution by a processor that cause the processor to:
determine optimal physical attribute values for defining a grip form factor on a microfluidic grip panel of a digital pen as a function of a correlation of the optimal physical attribute values to an intended use of the digital pen, wherein the optimal physical attribute values include a width dimension, a surface texture attribute, and shape pattern attribute that is defined as a function of the width dimension; and
drive the microfluidic grip panel into a grip form corresponding to the determined optimal physical attribute values during use of the digital pen by a user.

16. The computer program product of claim 15, wherein the intended use of the digital pen comprises drawing an output line having a line weight thickness via a stylus element of the pen; and
wherein the computer readable program code instructions for execution by the processor further cause the processor to determine the optimal physical attribute values for defining the grip form factor on the microfluidic grip panel by setting the width dimension used to define the shape pattern along a length of the microfluidic grip panel to a value chosen in proportion to the line weight thickness value.

17. The computer program product of claim 15, wherein the surface texture attribute comprises a hardness value that defines an amount of resilience force of the grip panel that resists against deformation of the panel from engaging finger pressure.

18. The computer program product of claim 17, wherein the computer readable program code instructions for execution by the processor further cause the processor to:
in response to determining that the user has trouble maintaining an engagement of the grip panel during operation of the pen, revise the hardness value of the surface texture attribute to drive the microfluidic grip panel to convey a softer resilience to the user.

19. The computer program product of claim 18, wherein the computer readable program code instructions for execution by the processor further cause the processor to:
in response to determining wet conditions for engaging the grip panel, revise the surface texture attribute to drive the microfluidic grip panel to form a high-friction surface texture.

20. The computer program product of claim 18, wherein the computer readable program code instructions for execution by the processor further cause the processor to:
in response to determining wet conditions for engaging the grip panel, revise the surface texture attribute to drive the microfluidic grip panel to form a high-friction surface texture.

* * * * *